(12) United States Patent
Chu et al.

(10) Patent No.: US 6,907,917 B2
(45) Date of Patent: Jun. 21, 2005

(54) GRAPHITE-BASED HEAT SINKS AND METHOD AND APPARATUS FOR THE MANUFACTURE THEREOF

(75) Inventors: Richard C. Chu, HopewellJunction, NY (US); Michael J. Ellsworth, Jr., Lagrangeville, NY (US); Egidio Marotta, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/340,445

(22) Filed: Jan. 10, 2003

(65) Prior Publication Data

US 2004/0134646 A1 Jul. 15, 2004

(51) Int. Cl.[7] .............................................. H05K 7/20
(52) U.S. Cl. ...................... 165/80.3; 165/185; 361/704
(58) Field of Search ....................... 228/183; 165/80.3, 165/185, 905; 361/704, 710; 174/16.3; 257/719, 722

(56) References Cited

U.S. PATENT DOCUMENTS

| | | | | |
|---|---|---|---|---|
| 3,527,688 | A | * 9/1970 | Umberto ..................... | 204/242 |
| 4,314,172 | A | * 2/1982 | Diepers ...................... | 310/248 |
| 4,714,623 | A | 12/1987 | Riccio et al. ................ | 427/27 |
| 5,100,737 | A | 3/1992 | Colombier et al. ......... | 428/612 |
| 5,494,753 | A | 2/1996 | Anthony ..................... | 428/408 |
| 5,695,883 | A | 12/1997 | Harada et al. .............. | 428/408 |
| 6,099,974 | A | * 8/2000 | Lenling ...................... | 428/548 |
| 6,113,991 | A | 9/2000 | Salito .......................... | 427/455 |
| 2003/0221816 | A1 | * 12/2003 | Ellsworth et al. .......... | 165/80.3 |
| 2004/0000391 | A1 | * 1/2004 | Getz et al. .................. | 165/80.3 |
| 2004/0094424 | A1 | * 5/2004 | Franz ......................... | 205/159 |

FOREIGN PATENT DOCUMENTS

JP          11080858 A    * 3/1999 ............. C22C/1/09

OTHER PUBLICATIONS

Dictionary of Occupational Titles (4th Ed., Rev. 1991)—Occupational Group Arrangement.

* cited by examiner

Primary Examiner—Allen J. Flanigan
(74) Attorney, Agent, or Firm—Floyd A. Gonzalez; Cantor Colburn LLP

(57) ABSTRACT

One embodiment of a heat sink comprises a metal support member having a groove disposed at a surface thereof and a fin disposed at the groove. The fin comprises a graphite-based material having a metal-based coating disposed thereon, and the fin is retained at the groove via a soldered joint at the metal-based coating and the groove. Another exemplary embodiment of a heat sink comprises a plurality of fins alternatingly arranged with a plurality of spacers. A method of fabricating a heat sink comprises preparing a surface of a graphite-based substrate, removing particulate matter generated from the preparation of the surface of the substrate, applying a metal-based coating at the surface of the substrate, and arranging the substrate to form a heat sink structure. An apparatus for cladding fins of a heat sink with a protective material comprises a first chamber that facilitates the preparation of substrate surfaces, a grit-removing apparatus disposed adjacent to the first chamber, a second chamber that facilitates the application of the protective material to the substrate surfaces, and a transport device configured to facilitate the movement of the substrates through the first chamber, to the grit-removing apparatus, and through the second chamber.

10 Claims, 3 Drawing Sheets

GRAPHITE-BASED HEAT SINKS AND METHOD AND APPARATUS FOR THE MANUFACTURE THEREOF

BACKGROUND

This disclosure relates generally to heat sinks and, more particularly, to graphite-based heat sinks and a method and an apparatus for the manufacture thereof.

Heat sinks are generally utilized to provide for the conductive transfer of heat from a heat source (e.g., an electronic component) to a surrounding environment. The conductive transfer of heat from the heat source is most efficient when the heat sink is fabricated from a material having a high coefficient of thermal conductivity to facilitate the rapid conduction of heat from the heat source and its dissipation to the surrounding environment. Such materials include metals such as copper, aluminum, tungsten, molybdenum, alloys of the foregoing metals, and the like. Heat sinks fabricated from such metals and alloys, however, while providing adequate heat transfer capabilities, typically add significant cost and weight to the systems into which they are incorporated.

To alleviate problems associated with weight, the fins of the heat sinks may be made of lighter materials having comparable or improved heat transfer properties. One example of such a material is high conductivity graphite, which may be utilized in a pure form or may be combined with another material to form a graphite composite. However, difficulties associated with the attachment of graphite or graphite composite heat sink fins pose significant obstacles to the use of such materials. In particular, because graphite is not solderable, attachment of graphite fins to a metal base are oftentimes made by alternate means, e.g., with adhesives such as epoxies. Furthermore, because graphite is by nature a brittle material, heat sink fins fabricated from graphite or graphite composites typically crack, chip, or flake, thereby potentially compromising the integrity of the heat sink structure. Chipping or flaking of the graphite or graphite composite material may further raise issues with respect to the contamination of the componentry of the device at which the heat sink is disposed. In particular, chipping or flaking of the graphite materials may contaminate and detrimentally affect the operation of electronic components from which heat must be removed to ensure the proper operation of an electronic system.

SUMMARY

Disclosed herein are heat sinks, a method for fabricating a heat sink, and an apparatus for cladding fins of a heat sink with protective material. One exemplary embodiment of a heat sink comprises a metal support member having a groove disposed at a surface thereof and a fin disposed at the groove. The fin comprises a graphite-based material having a metal-based coating disposed thereon, and the fin is retained at the groove via a soldered joint at the metal-based coating and the groove. Another exemplary embodiment of a heat sink comprises a plurality of fins alternatingly arranged with a plurality of spacers, the fins comprising a graphite-based material having a metal-based coating disposed thereon, and the spacers comprising either metal or graphite-epoxy coated with metal.

A method of fabricating a heat sink comprises preparing a surface of a graphite-based substrate, removing particulate matter generated from the preparation of the surface of the substrate, applying a metal-based coating at the surface of the prepared substrate, and arranging the prepared substrate having the metal-based coating to form a heat sink structure.

An apparatus for cladding fins of a heat sink with a protective material comprises a first chamber configured to facilitate the preparation of substrate surfaces of the fins of the heat sink, a grit-removing apparatus disposed adjacent to the first chamber, a second chamber disposed adjacent to the grit-removing apparatus and being configured to facilitate the application of the protective material to the substrate surfaces of the fins, and a transport device configured to facilitate the movement of the substrate surfaces through the first chamber, to the grit-removing apparatus, and through the second chamber.

BRIEF DESCRIPTION OF THE DRAWINGS

Referring to the exemplary drawings, wherein like elements are numbered alike in the several figures.

DETAILED DESCRIPTION

Disclosed herein are heat sinks having graphite-based fins. In one exemplary embodiment, a heat sink is defined by fins mounted within grooves disposed in a support surface. In another exemplary embodiment, a heat sink is defined by an alternating arrangement of fins and spacers. Also disclosed are methods of fabricating heat sinks by metallizing graphite-based substrates and either disposing the substrates as fins at a support or arranging the substrates with spacers. Exemplary materials that may be used for the metallizing include, but are not limited to, metals, alloys, metal-based composite materials, refractory materials, and the like. The metallizing of the substrates to form fins preferably provides a surface finish that facilitates the connection (e.g., the soldering) of the fins to the support. The metallizing also increases the robustness of the fins and further serves to form a protective coating that inhibits chipping and/or flaking of the graphite material, which may detrimentally affect the performance of the heat sink or the components associated therewith.

Figure 1:
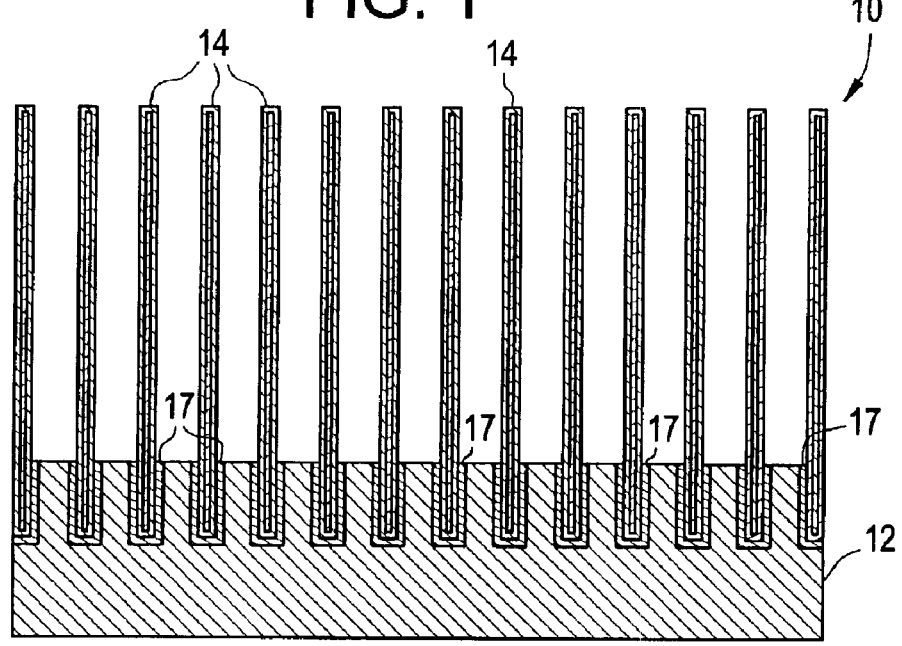
FIG. 1 is a cross-sectional representation of a heat sink having graphite-epoxy fins clad with a metal coating disposed in grooves of a metal support.
Figure 2:
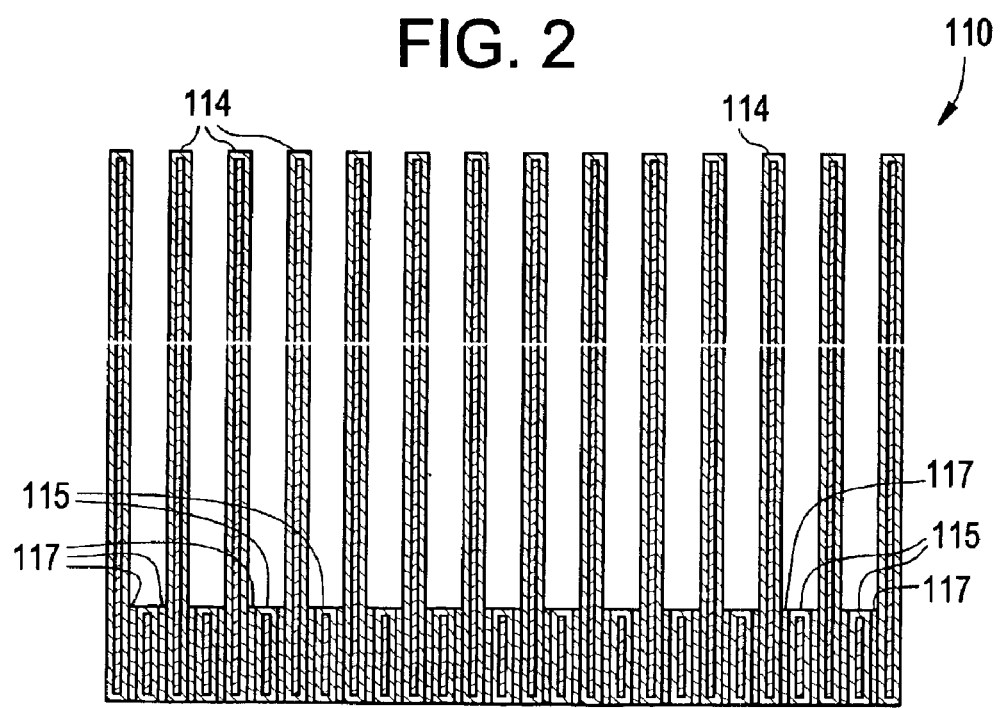
FIG. 2 is a cross-sectional representation of a heat sink having graphite-epoxy fins alternately arranged with spacers.

Referring to FIG. 1, a heat sink is shown generally at 10. Heat sink 10 comprises a support 12 and a plurality of fins 14 extending from support 12. Fins 14 are preferably disposed in grooves disposed within support 12 and secured therein. Alternately, as is shown in FIG. 2, a heat sink 110 may comprise an arrangement of alternatingly-positioned fins 114 and spacers 115 to form a heat sink structure. The fins 114 and spacers 115 are preferably fixed in a parallel-planar relationship by any suitable means, e.g., a solder joint 117. In either configuration, the heat sink is generally configured to be attached to a heat generating electrical device, e.g., a microchip module or a similar device.

Referring back to FIG. 1, the graphite-based fins 14 preferably comprise graphite or a graphite-epoxy composite (hereinafter "graphite") substrates clad with a metal ("metallized") to facilitate the securing of fins 14 within the grooves of support 12 and to inhibit the flaking or chipping of the graphite material. The foot portion of each fin 14 is preferably securely disposed at support 12 via a solder joint 17, although any suitable method of attachment such as ultrasonic welding, brazing, or the like may be utilized. Fins 14 are also planar in structure such that the facial areas of each fin 14 are maximized in order to effect a maximum amount of heat transfer from each fin 14 to the adjacent environment. The planar facial areas of each fin 14 may be of any configuration including, but not limited to, round, elliptical, angular, or any combination of the foregoing configurations.

Figure 3:
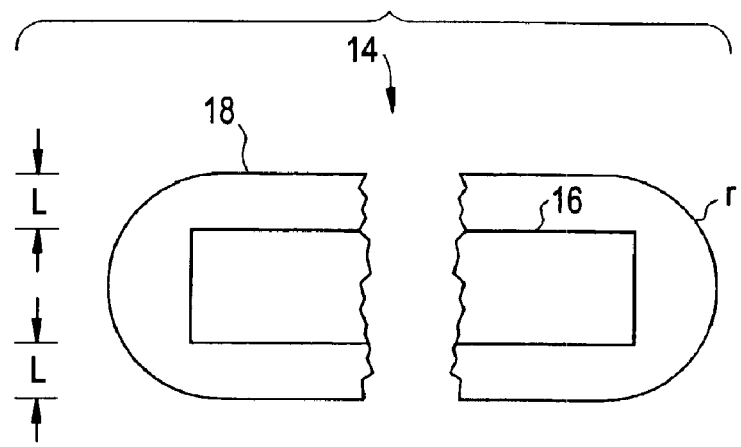
FIG. 3 is a plan view of a heat sink fin having a metal coating.

Referring now to FIG. 3, one exemplary embodiment of a metallized heat sink fin is shown at 14. The underlying structure of each fin 14 comprises the substrate 16 fabricated of the graphite. Substrate 16 is preferably substantially uniformly coated with the coating, shown at 18, thereby cladding the exposed surfaces. A substantially uniform coating is one in which variations in thickness of the coating over the area of the substrate to which the coating is applied are functions of the conditions under which the coating is applied (e.g., temperature, rheological characteristics of the coating material, method of application of the coating material, and the like). As is shown, both the facial surfaces as well as the edges of substrate 16 are coated to a thickness L of about 25 micrometers (um) to about 50 um. The edges may be defined by a radius r at the edges of substrate 16, which may be formed during the application of coating 18 as a result of the flow characteristics of the metal during its application.

As stated above, coating 18 is selected and disposed at the exposed surface of substrate 16 to allow for the soldering attachment of fins to support 12 (or to spacers) as well as to prevent damage to fins 14 and further to inhibit the flaking or chipping of the graphite material. The graphite from which substrate 16 is fabricated may allow the coating material to penetrate the surface of substrate 16 to a substantial degree, thereby securely cladding substrate 16. Coating 18 preferably comprises a lightweight metal having a high coefficient of thermal transfer and having corrosion inhibitive- or preventive properties and sufficient durability when applied to substrate 16 such that damage to fins 14 during handling of the heat sink is avoided or at least minimized. Metals that may be used include, but are not limited to, aluminum, zinc, copper, silver, nickel, alloys of the foregoing metals, high temperature refractory coatings, combinations of the foregoing materials, and the like. A preferred coating material comprises about 85% zinc and about 15% aluminum. A more preferred coating comprises pure or near-pure zinc.

Referring now to both FIGS. 1 and 3, fins 14 are typically prepared and coated prior to assembly of heat sink 10. In one exemplary embodiment, the cladding of fins 14 comprises the preparation of substrate 16 and the application of coating 18 to substrate 16 to form fins 14 prior to the mounting of fins 14 at support 12. The preparation of substrate 16 typically comprises abrading the substrate surface. One method of abrading the substrate surface comprises a sand-blasting or grit-blasting process, which increases the area of the substrate surface and creates an anchor profile on the surface to enhance the adhesion of the protective coating to the graphite. The preparation of substrate 16 may further comprise removing the particulate matter resulting from the sand-blasting or grit-blasting process. Abrading the substrate surface may further provide for the cleaning of the surface (e.g., the removal of foreign particulate material and minor imperfections embedded in the surface layers of the material). The preparation of the substrate surface may be effected by other methods such as, for example, reactive ion etching in which chemically active ions are accelerated along the lines of a generated electromagnetic field to bombard the substrate surface perpendicular to the plane in which the surface extends, thereby removing the surface layer.

The application of coating 18 to substrate 16 typically comprises the spray deposition of the metal, alloy, or refractory material onto the prepared surface of substrate 16. Preferably, the coating is applied to the surface of substrate 16 utilizing an arc spray technique. In the arc spray technique, an arc is struck between two wire electrodes fabricated of the metal to be deposited, and the electrodes are melted by the heat generated from the arc. As the electrodes are melted, a pressurized gas is directed at the electrodes, and the molten metal droplets are projected at substrate 16 and impinged on the substrate surface at high velocity. In another method of the application of coating 18 known as the flame spray technique, the metal is melted via a flame generated from a combustible gas, and the molten metal droplets are projected onto a heated substrate 16. Other techniques by which coating 18 may be disposed on substrate include, but are not limited to, vapor deposition.

Figure 4:
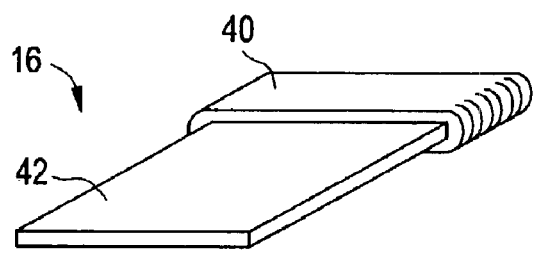
FIG. 4 is a perspective view of a fin of a heat sink in which a protective coating can be selectively applied using a mask.

The coating may be selectively applied by masking areas of substrates 16. In one embodiment as is shown with reference to FIG. 4, a masking material 40 is applied to some areas of substrate 16 to allow substrate 16 to be metallized solely at the non-masked areas 42. Coating material applied to some surfaces (particularly to the surfaces at which the fins are joined to the body to form the heat sink) facilitates the effectiveness of the soldered joints by which the fins are easily and readily attached to the body while allowing the weight of the fin to be kept to a minimum. Thus, masking material 40 allows the heat transfer surfaces to remain free of the coating. In other embodiments, because chipping and flaking of the composite material generally occurs at the corners and edges of substrate 16, masking material 40 may also be applied to the facial areas of substrate 16 in order to avoid the unnecessary disposing of excess coating material on substrate 16, further limiting the amount of coating material unnecessarily disposed on substrate 16.

Figure 5:
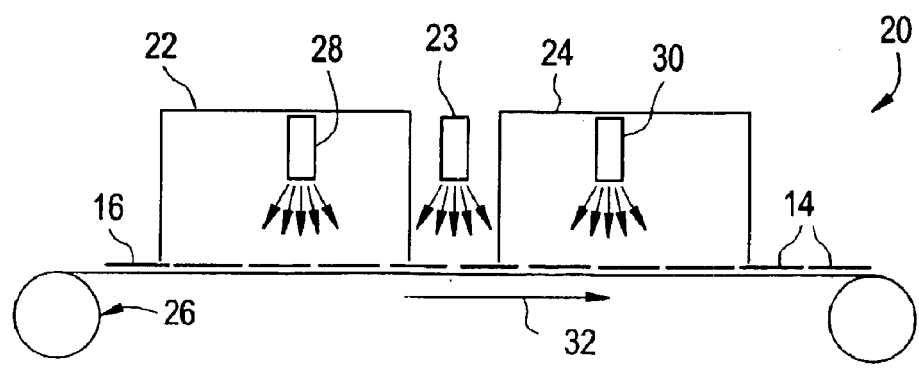
FIG. 5 is a schematic representation of an apparatus by which the fins of the heat sink of FIG. 1 may be coated.

Referring now to FIG. 5, the apparatus by which substrates 16 are clad with the protective material is shown generally at 20. Apparatus 20 allows for the preparation of the surfaces of substrates 16 and the application of the coating material in an assembly line format to form fins 14, which may be assembled with supports to form heat sinks. Apparatus 20 comprises a first chamber 22, a second chamber 24, and a transport device 26 by which substrates 16 can be transported through chambers 22, 24 for preparation and application of the coating. A grit-removing apparatus 23 is preferably disposed intermediate chambers 22, 24 to remove residue and particulate matter generated in the abrading process. The transport of substrates 16 through apparatus 20 is preferably automated and controlled via a control system (not shown) disposed in communication with apparatus 20.

First chamber 22 is preferably an area in which the surfaces of substrates 16 may be prepared for the subsequent application of the protective material to form the coating. As stated above, the preparation of substrates 16 typically comprises an abrasive treatment of the surfaces of substrates 16. Such an abrasive treatment is effected via the mechanical operation of a suitable treatment device 28, e.g., a sand-blasting or grit-blasting device or a reactive ion etching device.

Grit-removing apparatus 23 preferably comprises a jet of inert gas directed at the surfaces of fins 14. Other apparatuses similarly operated, e.g., solvent or aqueous sprayers optionally followed by blow dry streams, may alternately provide for the removal of grit generated in the abrading process.

Second chamber 24 is an area in which the protective coatings are disposed at the prepared substrates 16. Preferably, second chamber 24 is disposed adjacent to grit-removing apparatus 23 such that a continuous feed of substrates 16 can be maintained through apparatus 20. As stated above, the application of the protective coating is effected via the operation of a spray device 30, which is preferably an arc spray device.

Transport device 26 provides for the assembly line treatment of substrates 16 to form fins 14 that may be assembled to form the heat sinks. The assembly line treatment is effected by the movement of the workpiece substrates 16 through chambers 22, 24 in the direction of an arrow 32. Movement of substrates 16 may be either continual or continuous; in either case, however, the movement is preferably automated such that operator intervention is minimal and controlled such that the level of skill required to operate apparatus 20 is low. Transport device 26 may be a conveyor belt, as is shown. Other devices that may provide for the transport of substrates through the chambers include, but are not limited to, carousels, trolleys, and the like. The product fins 14 are removed from transport device 26 preferably subsequent to their exiting from second chamber 24.

Another exemplary embodiment of cladding fins 14 comprises preparing only the surfaces of the fins at which contact is made during the handling or assembly of the heat sink and applying the protective material only to those surfaces. Handling surfaces are typically the line-of-sight surfaces that comprise the outer edges of the fins as well as the facial surfaces of the fins disposed at the ends of a heat sink. Handling surfaces may, however, comprise the surfaces of the fins intermediate the edges.

Figure 6:
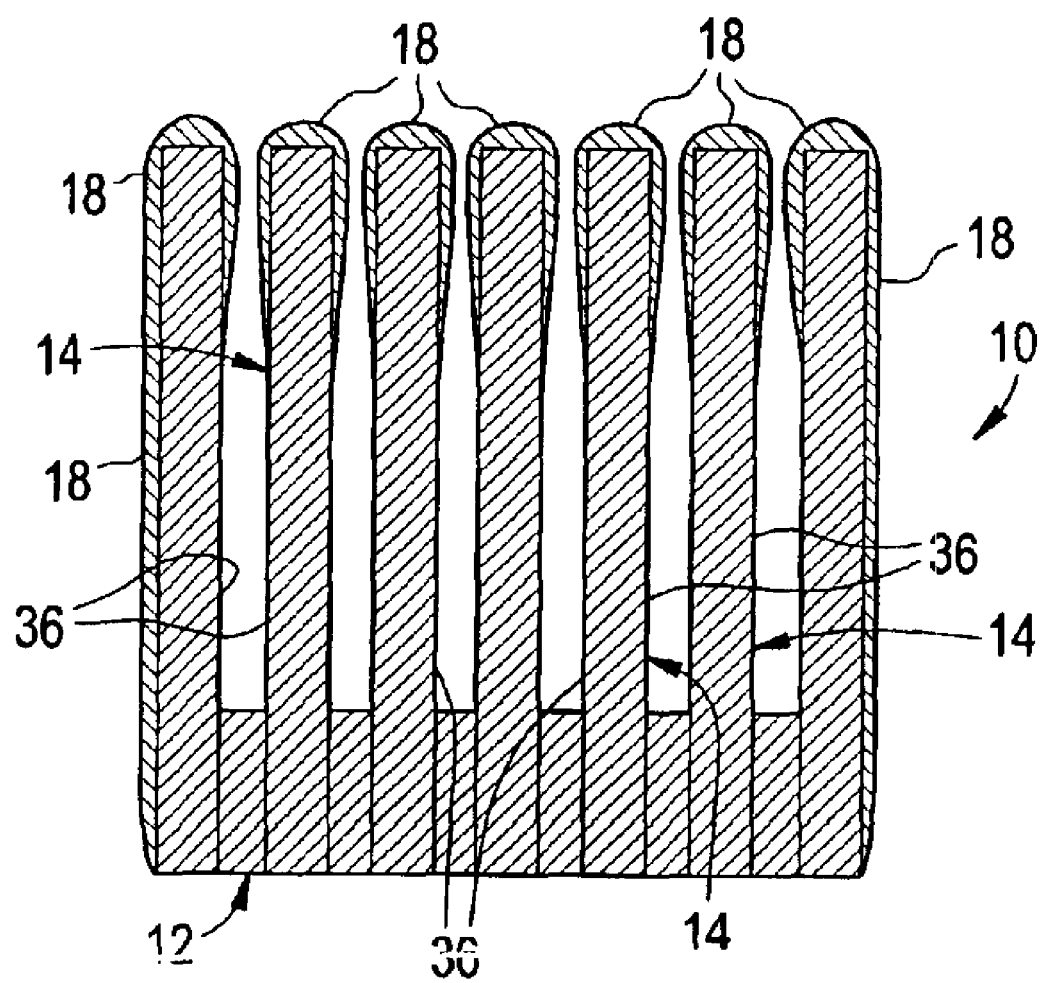
FIG. 6 is a cross-sectional representation of a heat sink having graphite-epoxy fins clad with protective coatings disposed at line-of-sight surfaces.

Referring now to FIG. 6, heat sink 10 on which only the line-of-sight surfaces are coated is shown. In such an embodiment, heat sink 10 is fully assembled by disposing the graphite fins 14 at the grooves of support 12 by any suitable means prior to coating. Cladding of the line-of-sight surfaces, particularly those surfaces at the edges of the fins and at which contact is made during the handling or assembly of heat sink 10, provides a protective coating to inhibit the chipping and/or flaking of the graphite-epoxy composite material while surfaces 36 at which contact is less likely to be made remain uncoated or minimally coated. As described above, application of coating 18 to the line-of-sight surface enhances the robustness of the assembled heat sink 10. The line-of-sight surfaces of the assembled heat sink 10 may be prepared and coated using techniques similar to those described above.

While the invention has been described with reference to an exemplary embodiment, it will be understood by those of skill in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat sink, comprising:
   a support member comprising a metal; and
   a fin comprising a graphite-based material having a metal-based, sprayed-on coating disposed thereon, said fin being retained via a soldered joint at said metal-based coating and said metal of said support member;
   wherein said metal-based coating is selectively applied such that said metal-based coating is substantially disposed solely at an interface between said fin and said groove.

2. The heat sink of claim 1, wherein said graphite-based material is a material selected from the group of materials consisting of graphite and graphite-epoxy composites.

3. The heat sink of claim 1, wherein said metal-based coating is a material selected from the group of materials consisting of aluminum, zinc, copper, silver, nickel, alloys of the foregoing materials, refractory materials, and combinations of the foregoing materials.

4. A heat sink, comprising:
   a support member comprising a metal; and
   a fin comprising a graphite-based material having a metal-based, sprayed-on coating disposed thereon, said fin being retained via a soldered joint at said metal-based coating and said metal of said support member;
   wherein said metal based coating is an alloy of about 85% zinc and about 15% aluminum.

5. A heat sink, comprising:
   a support member comprising a metal; and
   a fin comprising a graphite-based material having a metal-based, sprayed-on coating disposed thereon, said fin being retained via a soldered joint at said metal-based coating and said metal of said support member;
   wherein said metal-based coating is applied only to edges of said fin.

6. A heat sink, comprising:
   a support member comprising a metal; and
   a fin comprising a graphite-based material having a metal-based, sprayed-on coating disposed thereon, said fin being retained via a soldered joint at said metal-based coating and said metal of said support member;
   wherein said metal-based coating is applied only to corners of said fin.

7. A heat sink, comprising:
   a support member comprising a metal; and
   a fin comprising a graphite-based material having a metal-based, vapor deposited coating disposed thereon, said fin being retained via a soldered joint at said metal-based coating and said metal of said support member;
   wherein said metal-based coating is selectively applied such that said metal-based coating is substantially disposed solely at an interface between said fin and said groove.

8. A heat sink, comprising:
   a support member comprising a metal; and
   a fin comprising a graphite-based material having a metal-based, vapor deposited coating disposed thereon, said fin being retained via a soldered joint at said metal-based coating and said metal of said support member;
   wherein said metal based coating is an alloy of about 85% zinc and about 15% aluminum.

9. A heat sink, comprising:
   a support member comprising a metal; and
   a fin comprising a graphite-based material having a metal-based, vapor deposited coating disposed thereon, said fin being retained via a soldered joint at said metal-based coating and said metal of said support member;
   wherein said metal-based coating is applied only to edges of said fin.

10. A heat sink, comprising:
    a support member comprising a metal; and
    a fin comprising a graphite-based material having a metal-base vapor deposited coating disposed thereon, said fin being retained via a soldered joint at said metal-based coating and said metal of said support member;
    wherein said metal-based coating is applied only to corners of said fin.

* * * * *